United States Patent
Chen et al.

(10) Patent No.: US 10,779,407 B1
(45) Date of Patent: Sep. 15, 2020

(54) MULTILAYER CIRCUIT BOARD AND MANUFACTURING METHOD THEREOF

(71) Applicant: CHUNGHWA PRECISION TEST TECH. CO., LTD., Taoyuan (TW)

(72) Inventors: Yi-Chun Chen, Taoyuan (TW); Chao-Chiang Liu, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 16/398,317

(22) Filed: Apr. 30, 2019

(30) Foreign Application Priority Data

Mar. 13, 2019 (TW) .............................. 108108525 A (51) Int. Cl.
| | |
|---|---|
| *H05K 1/11* | (2006.01) |
| *H05K 1/14* | (2006.01) |
| *H05K 3/46* | (2006.01) |
| *H05K 3/42* | (2006.01) |
| *H05K 3/00* | (2006.01) |

(52) U.S. Cl.
CPC ............. *H05K 1/115* (2013.01); *H05K 1/113* (2013.01); *H05K 1/114* (2013.01); *H05K 1/144* (2013.01); *H05K 3/0094* (2013.01); *H05K 3/429* (2013.01); *H05K 3/4644* (2013.01)

(58) Field of Classification Search
CPC .................................. H05K 1/113; H05K 1/114
USPC .................................................. 174/262–266
See application file for complete search history.

(56) References Cited

U.S. PATENT DOCUMENTS

| | | | |
|---|---|---|---|
| 2011/0079420 A1* | 4/2011 | Chang ..................... | B32B 18/00 174/262 |
| 2012/0007254 A1* | 1/2012 | Yang .................... | H01L 23/4985 257/774 |
| 2015/0075848 A1* | 3/2015 | Naganuma ........... | H05K 3/4623 174/255 |

* cited by examiner

*Primary Examiner* — Jeremy C Norris
(74) *Attorney, Agent, or Firm* — Mark M. Friedman (57) ABSTRACT

A multilayer circuit board and a manufacturing method thereof are provided. The multilayer circuit board includes: a first board having a first conductive via hole; a first conductive layer formed on the first board and the first conductive via hole; a second board disposed on the first board and the first conductive layer and having a second conductive via hole; and a second conductive layer formed on the second board and the second conductive via hole. The first conductive layer and the second conductive layer contact with each other and cooperatively define a connecting part, and the connecting part of the first conductive layer and the second conductive layer includes concave-convex surfaces for engaging with each other.

13 Claims, 10 Drawing Sheets

MULTILAYER CIRCUIT BOARD AND MANUFACTURING METHOD THEREOF

CROSS REFERENCE TO RELATED APPLICATION

This application claims priority to Taiwan Application Serial No. 108108525, filed Mar. 13, 2019, the disclosure of which is incorporated herein by reference.

FIELD OF DISCLOSURE

The present disclosure relates to a circuit board, and more particularly to a multilayer circuit board and manufacturing method thereof.

BACKGROUND

Nowadays, a trend of a shape of electronic products is toward thin and slim. Multilayer circuit boards (such as package substrate, printed circuit board, high density interconnect (HDI), probe card carrier board, etc.) serve as carrier boards for integrating electronic components in the electronic products. A trace density and an integrated density of interlayer interconnections of the multilayer circuit board will directly affect an electrical performance and a thickness of the electronic product, which is a factor deciding a degree of miniature of the product. Therefore, in manufacturing the multilayer circuit board, a design and fabrication of stacked via holes have become a developing focus of the interlayer interconnection technology of the multilayer circuit board.

Figure 1:
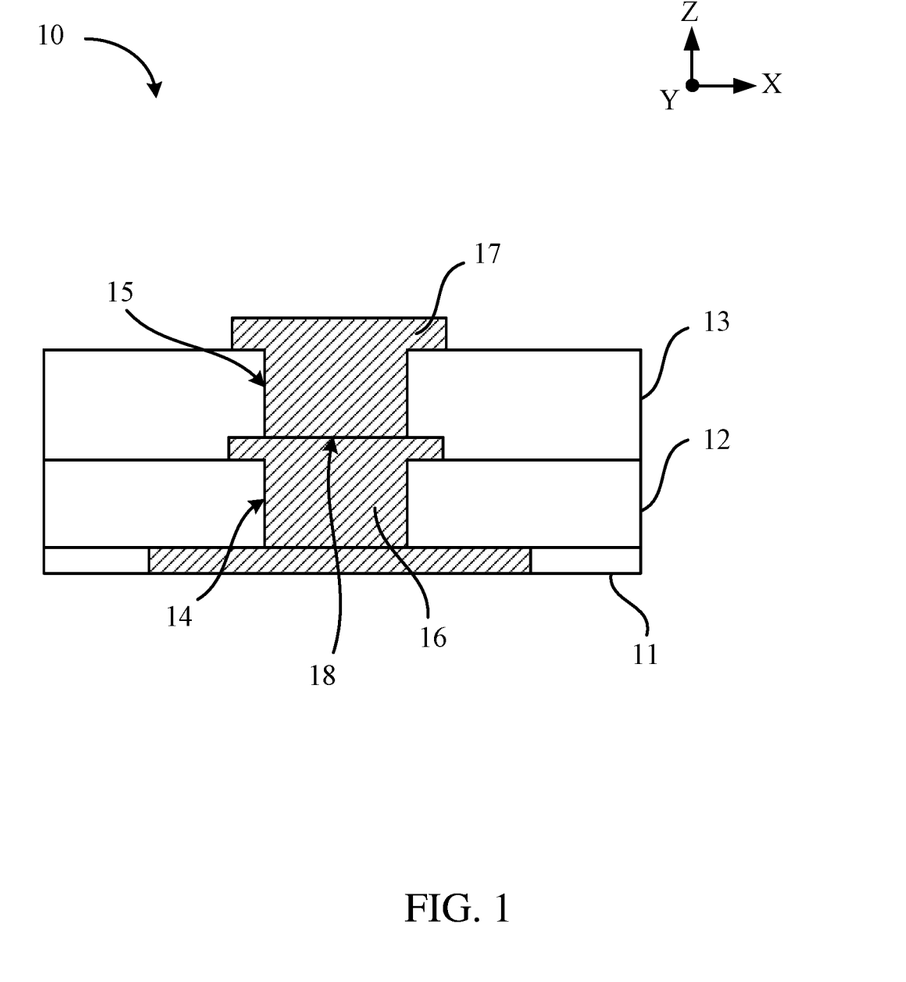
FIG. 1 is a schematic diagram of a multilayer circuit board of the prior art.

The stacked via holes are interfaces created by metal deposition for electrically connecting upper and lower circuit boards. Please refer to FIG. 1, which shows a schematic diagram of a multilayer circuit board 10 of the prior art. The multilayer circuit board 10 includes a base plate 11, a first board 12, a second board 13, a first conductive layer 16, and a second conductive layer 17. The first board 12 is provided with a first conductive via hole 14, and the second board 13 is provided with a second conductive via hole 15. The first conductive layer 16 fills the first conductive via hole 14, and the second conductive layer 17 fills the second conductive via hole 15. The second board 13 is stacked on the first board 12, and the first board 12 and the second board 13 are electrically contacted to each other by the first conductive layer 16 and the second conductive layer 17 which are in contact with each other. In the multilayer circuit board 10 of the prior art, the connecting part 18 of the first conductive layer 16 and the second conductive layer 17 is a two-dimensional plane, that is, an X-Y plane.

However, during manufacturing, the first conductive layer 16 and the second conductive layer 17 are not formed continuously by the same process. Instead, the first conductive layer 16 is formed first, and the second conductive layer 17 is sequentially formed by another process. Therefore, the connecting part 18 interconnecting the first conductive layer 16 and the second conductive layer 17 is easily to break, causing the stacked via holes to be disconnected and accordingly a resistance value between the first conductive layer 16 and the second conductive layer 17 to be large. Specifically, please refer to FIG. 2, which is a schematic diagram showing the first conductive layer 16 and the second conductive layer 17 of the multilayer circuit board 10 of FIG. 1 being separated from each other. Material of a conductive layer and material of the first board 12 and the second board 13 have different thermal expansion coefficients. When the multilayer circuit board 10 is in a critical condition (such as in a high temperature or high humidity environment, or being subjected to thermal shock during the process), the first conductive layer 16 and the second conductive layer 17 will deform, and the first conductive layer 16 and the second conductive layer 17 will separate from each other around the connecting part 18.

Figure 2:
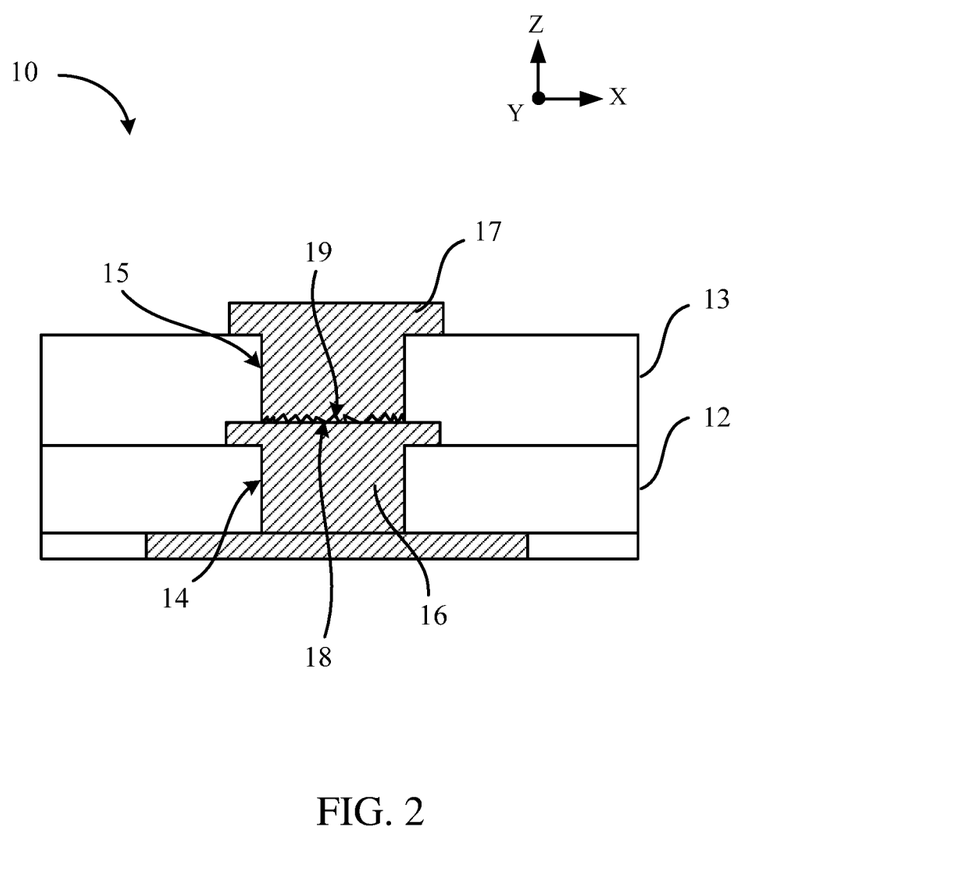
FIG. 2 is a schematic diagram showing the first conductive layer and the second conductive layer of the multilayer circuit board of FIG. 1 being separated from each other.

As shown in FIG. 2, at the disconnected connecting part 18, a plurality of pores 19 may be formed between the first conductive layer 16 and the second conductive layer 17, thereby forming an open circuit. Thus, the resistance value between the first conductive layer 16 and the second conductive layer 17 is increased, thereby decreasing an electrical performance of the multilayer circuit board 10.

Accordingly, it is necessary to provide a multilayer circuit board and manufacturing method thereof to solve the technical problem in the prior art.

SUMMARY OF DISCLOSURE

In order to solve technical problems mentioned above, an object of the present disclosure is to provide a multilayer circuit board and manufacturing method thereof, in which by designing a metal connecting part at stacked via holes as a three-dimensional surface, a contact area between two conductive layers is increased, thereby avoiding a use of a two-dimensional connecting part in the prior art, resulting in the two conductive layers being easily deformed and separated from each other, thereby increasing a resistance value.

In order to achieve the objects described above, the present disclosure provides a multilayer circuit board, including: a first board including a first conductive via hole; a first conductive layer formed on the first board and the first conductive via hole; a second board disposed on the first board and the first conductive layer and including a second conductive via hole; and a second conductive layer formed on the second board and the second conductive via hole, where the first conductive layer and the second conductive layer contact with each other and cooperatively define a connecting part, and the connecting part of the first conductive layer and the second conductive layer includes concave-convex surfaces which engage with each other.

In one preferable embodiment of the present disclosure, the first conductive via hole includes a first end and a second end respectively formed on opposite sides of the first board; the first conductive layer fills the first conductive via hole and seals the first end of the first conductive via hole; and a surface of the first conductive layer is formed with a recess, and the recess is recessed in the second end of the first conductive via hole.

In one preferable embodiment of the present disclosure, a surface of the second conductive layer is formed with a protrusion, and the recess of the first conductive layer is electrically contacted to the protrusion of the second conductive layer, and the connecting part includes contact surfaces of the recess and the protrusion.

In one preferable embodiment of the present disclosure, the second conductive via hole includes a third end formed on a surface of the second board; and the second conductive layer fills the second conductive via hole and seals the third end of the second conductive via hole, and the protrusion of the second conductive layer protrudes outward from the third end of the second conductive via hole.

In one preferable embodiment of the present disclosure, the first conductive layer further includes an annular portion formed on the first board, and the annular portion is adjacent to the second end of the first conductive via hole and connected to a top end of the recess.

In one preferable embodiment of the present disclosure, the first conductive via hole includes a first end and a second end respectively formed on opposite sides of the first board; the first conductive layer fills the first conductive via hole, and seals the first end and the second end of the first conductive via hole; and a surface of the first conductive layer is formed with a protrusion, and the protrusion protrudes outward from the second end of the first conductive via hole.

In one preferable embodiment of the present disclosure, a surface of the second conductive layer is formed with a recess, and the recess of the second conductive layer is electrically contacted to the protrusion of the first conductive layer, and the connecting part includes contact surfaces of the recess and the protrusion.

In one preferable embodiment of the present disclosure, the second conductive via hole includes a third end formed on a surface of the second board; and the second conductive layer fills the second conductive via hole, and the recess of the second conductive layer is recessed in the third end of the second conductive via hole.

In one preferable embodiment of the present disclosure, the first conductive layer further includes an annular portion formed on the first board, and the annular portion is adjacent to the second end of the first conductive via hole and connected to the protrusion.

In one preferable embodiment of the present disclosure, a hole diameter of the second conductive via hole is greater than a hole diameter of the first conductive via hole The present disclosure also provides a manufacturing method of a multilayer circuit board, including: providing a first board; forming a first conductive via hole on the first board; forming a first conductive layer on the first board and the first conductive via hole; disposing a second board on the first board and the first conductive layer; forming a second conductive via hole on the second board; and forming a second conductive layer on the second board and the second conductive via hole, where the first conductive layer and the second conductive layer contact with each other and cooperatively define a connecting part, and the connecting part of the first conductive layer and the second conductive layer includes concave-convex surfaces which engage with each other.

In one preferable embodiment of the present disclosure, the first conductive via hole includes a first end and a second end respectively formed on opposite sides of the first board, and the step of forming the first conductive layer on the first board and the first conductive via hole includes: depositing a first metal material on the first board and the first conductive via hole to form the first conductive layer filling the first conductive via hole and sealing the first end of the first conductive via hole, where a thickness of the first conductive layer is uniform, and a surface of the first conductive layer is formed with a recess, and the recess is recessed in the second end of the first conductive via hole.

In one preferable embodiment of the present disclosure, the first conductive via hole includes a first end and a second end respectively formed on opposite sides of the first board, and the step of forming the first conductive layer on the first board and the first conductive via hole includes: depositing a first metal material on the first board and the first conductive via hole to fill the first conductive via hole and seal the first end and the second end of the first conductive via hole; and forming a blind hole on a surface of the first metal material to form a recess on a surface of the first conductive layer, where the recess is recessed in the second end of the first conductive via hole.

In one preferable embodiment of the present disclosure, the step of forming the second conductive layer on the second board and the second conductive via hole includes: depositing a second metal material on the first conductive layer, the second board, and the second conductive via hole to form the second conductive layer filling the recess of the first conductive layer and the second conductive via hole, where a surface of the second conductive layer is formed with a protrusion corresponding to the recess of the first conductive layer, and the recess of the first conductive layer is electrically contacted to the protrusion of the second conductive layer, and the connecting part includes contact surfaces of the recess and the protrusion.

In one preferable embodiment of the present disclosure, the first conductive via hole includes a first end and a second end respectively formed on opposite sides of the first board, and the step of forming the first conductive layer on the first board and the first conductive via hole includes: depositing a first metal material on the first board and the first conductive via hole to form the first conductive layer filling the first conductive via hole and sealing the first end and the second end of the first conductive via hole, where a deposition surface of the first metal material protrudes outward from the second end of the first conductive via hole such that a surface of the first conductive layer is formed with a protrusion.

In one preferable embodiment of the present disclosure, the step of forming the second conductive layer on the second board and the second conductive via hole includes: depositing a second metal material on the first conductive layer, the second board, and the second conductive via hole to form the second conductive layer covering the protrusion of the first conductive layer and the second conductive via hole, where a surface of the second conductive layer is formed with a recess corresponding to the protrusion of the first conductive layer, and the protrusion of the first conductive layer is electrically contacted to the recess of the second conductive layer, and the connecting part includes contact surfaces of the recess and the protrusion.

In comparison to prior art, the present disclosure discloses that a metal connecting part at stacked via holes of the multilayer circuit board is designed as with three-dimensional surface, that is, the connecting part not only includes a plane extending in X and Y directions, but also includes side surfaces extending along a Z direction, thereby increasing a contact area between the first conductive layer and the second conductive layer. Therefore, the first conductive layer and the second conductive layer of the present disclosure increase a vertical conduction path under the existing planar metal conduction connection design, so that the first conductive layer and the second conductive layer are prevented from being deformed when the multilayer circuit board is in a high temperature and high humidity application environment, or subjected to thermal shock in the process. This is because expansion coefficients of a metal material and a dielectric material are different, and the first conductive layer and the second conductive layer will separate from each other around the connecting part.

DETAILED DESCRIPTION

The structure and the technical means adopted by the present disclosure to achieve the above and other objects can be best understood by referring to the following detailed description of the preferred embodiments and the accompanying drawings.

Figure 3:
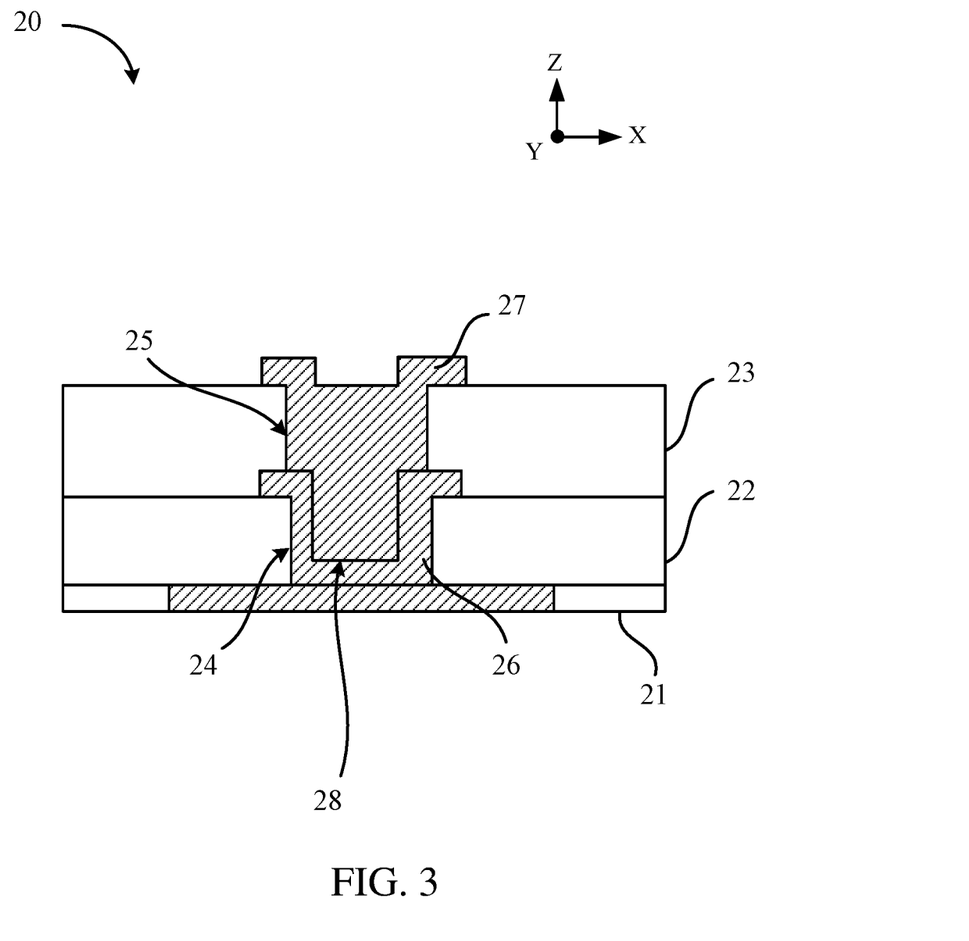
FIG. 3 is a schematic diagram showing a multilayer circuit board according to a first preferred embodiment of the present disclosure.

Please refer to FIG. 3, which is a schematic diagram showing a multilayer circuit board 20 according to a first preferred embodiment of the present disclosure. The multilayer circuit board 20 is a carrier board that integrates electronic components in an electronic product, and includes a package substrate, a printed circuit board, a high density interconnect (HDI), a probe card carrier, and the like. The multilayer circuit board 20 includes a base plate 21, a first board 22, a second board 23, a first conductive layer 26, and a second conductive layer 27. The first conductive layer 26 is disposed on the first board 22, and the second conductive layer 27 is disposed on the second board 23. Preferably, the base plate 21, the first board 22, and the second board 23 are made of an electrically insulating, dielectric material, and the three layers are stacked one on another. Moreover, the multilayer circuit board 20 transmits signals longitudinally through the base plate 21, the first board 22, and the second board 23 via the first conductive layer 26, the second conductive layer 27, and the conductive layer formed on the base plate 21.

As shown in FIG. 3, the first board 22 is provided with a first conductive via hole 24, and the second board 23 is provided with a second conductive via hole 25. Preferably, a position of the second conductive via hole 25 corresponds to a position of the first conductive via hole 24. The first conductive layer 26 is formed on the first board 22 and the first conductive via hole 24. The second conductive layer 27 is formed on the second board 23 and the second conductive via hole 25. The first conductive layer 26 and the second conductive layer 27 contact and electrically connect with each other, and cooperatively define a connecting part 28. The connecting part 28 of the first conductive layer 26 and the second conductive layer 27 includes concave-convex surfaces for engaging with each other; that is, a three-dimensional surface including three directions of XYZ. The specific structure and manufacturing method of the multilayer circuit board 20 of the present disclosure will be described below by referring to FIG. 4A to FIG. 4F or FIG. 5A to FIG. 5D.

Figure 4A:
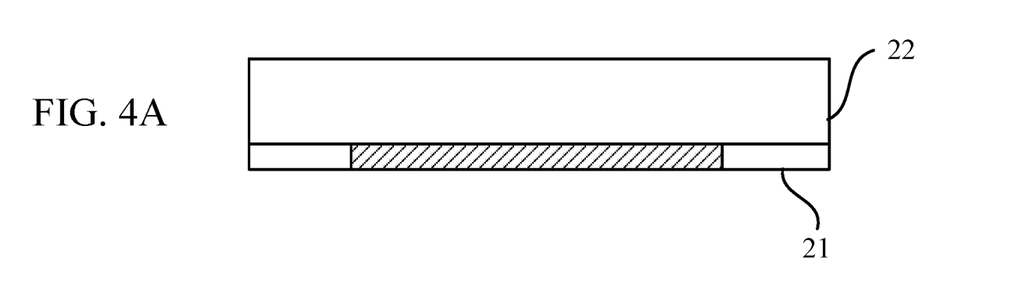
FIG. 4A to FIG. 4F are a series of schematic diagrams for showing a manufacturing process of the multilayer circuit board of FIG. 3.
Figure 4B:
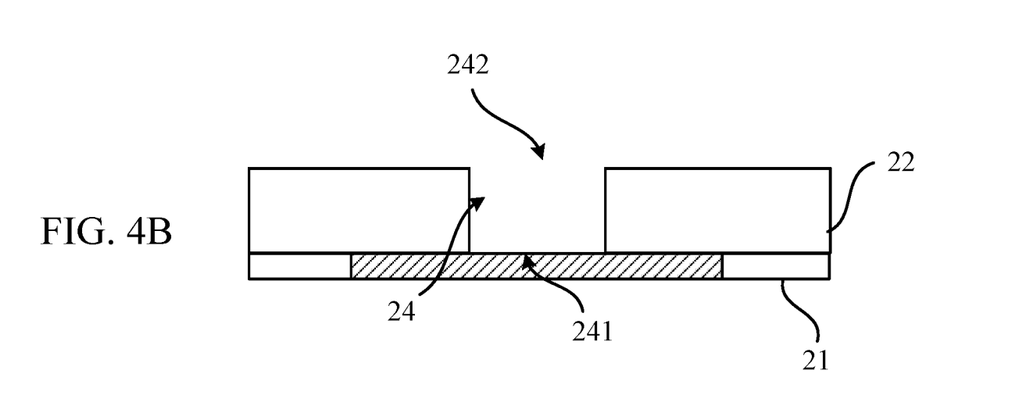

FIG. 4A to FIG. 4F are a series of schematic diagrams for showing a manufacturing process of the multilayer circuit board 20 of FIG. 3. First, as shown in FIG. 4A, the base plate 21 having a conductive layer and the first board 22 are provided, wherein the first board 22 is disposed on the base plate 21. Then, as shown in FIG. 4B, the first conductive via hole 24 is formed on the first board 22, wherein the first conductive via hole 24 includes a first end 241 and a second end 242 located on opposite sides of the first board 22.

Figure 4C:
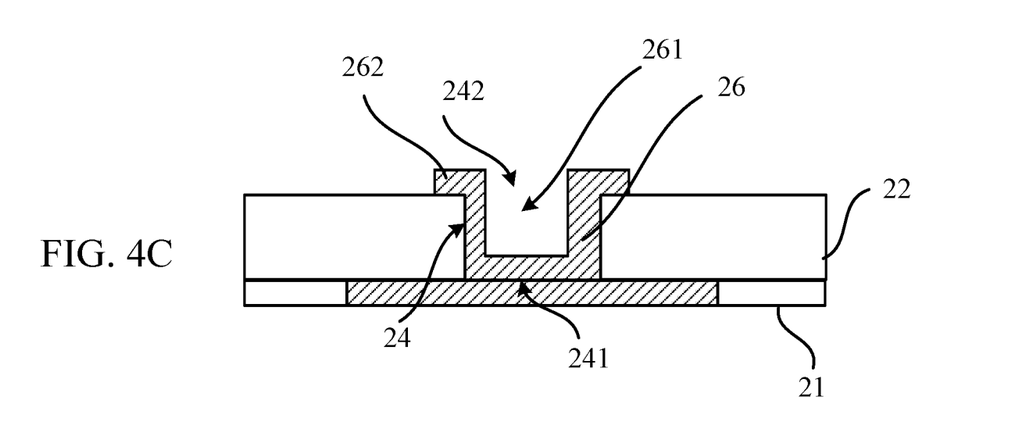

As shown in FIG. 4C, the first conductive layer 26 is formed on the first board 22 and the first conductive via hole 24, wherein the first conductive layer 26 is disposed only on a portion of the first board 22 instead of covering the first board 22 over an entire surface thereof. Specifically, in the first embodiment, a first metal material is deposited on the first board 22 and the first conductive via hole 24 by a through-hole plating process to form the first conductive layer 26 fills the first conductive via hole 24 and seals the first end 241 of the first conductive via hole 24. A thickness of the first conductive layer 26 in the first conductive via hole 24 is uniform such that a surface of the first conductive layer 26 is formed with a recess 261, and the recess 261 is relatively recessed in the second end 242 of the first conductive via hole 24. Also, the first conductive layer 26 also includes an annular portion 262 formed on the first board 22. The annular portion 262 is adjacent to the second end 242 of the first conductive via hole 24 and is connected to a top end of the recess 261.

Figure 4D:
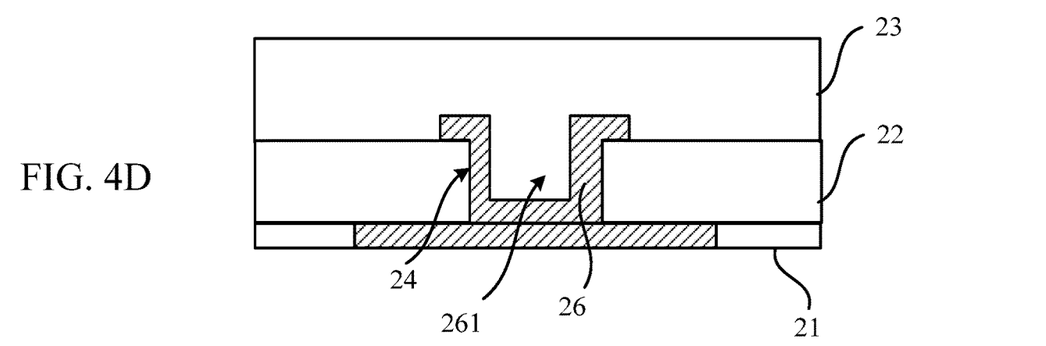
Figure 4E:
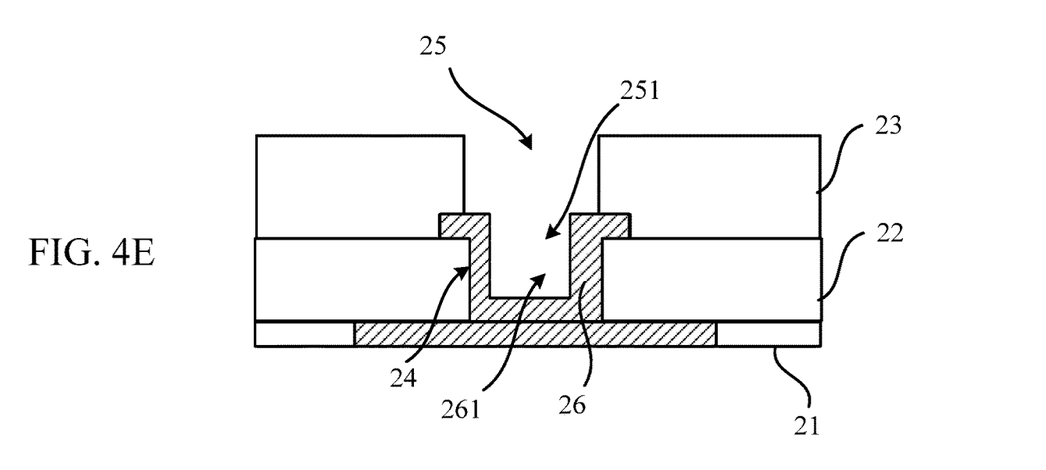

As shown in FIG. 4D, the second board 23 is disposed on the first board 22 and the first conductive layer 26. Then, as shown in FIG. 4E, the second conductive via hole 25 is formed on the second board 23. Preferably, a position of the second conductive via hole 25 corresponds to a position of the first conductive via hole 24. The second conductive via hole 25 includes a third end 251 located on a surface of the second board 23, wherein the third end 251 of the second conductive via hole 25 is adjacent to the first conductive layer 26.

Figure 4F:
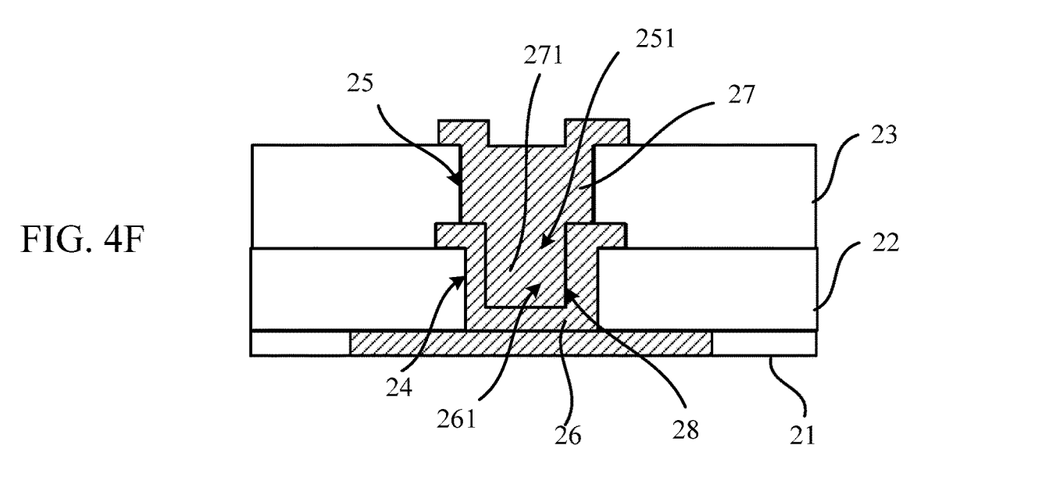

Finally, as shown in FIG. 4F, the second conductive layer 27 is formed on the second board 23 and the second conductive via hole 25, thereby completing the fabrication of the multilayer circuit board 20. The second conductive layer 27 is disposed only on a portion of the second board 23 instead of covering the second board 23 over an entire surface. Specifically, in the first embodiment, a second metal material is deposited on the first conductive layer 26, the second board 23, and the second conductive via hole 25 by a through-hole plating process to form the second conductive layer 27 fills the recess 261 of the first conductive layer 26 and the second conductive via hole 25. The second conductive layer 27 fills the second conductive via hole 25 and seals the third end 251 of the second conductive via hole 25, and a surface of the second conductive layer 27 is formed with a protrusion 271 corresponding to the recess 261 of the first conductive layer 26. That is, the protrusion 271 of the second conductive layer 27 relatively protrudes outward from the third end 251 of the second conductive via hole 25. The recess 261 of the first conductive layer 26 is in electrical contact with the protrusion 271 of the second conductive layer 27 and cooperatively defines a connecting part 28. The connecting part 28 of the first conductive layer 26 and the second conductive layer 27 includes concave-convex surfaces for engaging with each other, that is, a three-dimensional surface including three directions of XYZ.

In the first embodiment, the metal connecting part 28 at the stacked via holes (i.e., a junction of the first conductive layer 26 and the second conductive layer 27) is designed with the three-dimensional surface, that is, an inner sidewall of the recess 261 of the first conductive layer 26 runs around an outer sidewall of the protrusion 271 of the second conductive layer 27, thereby increasing the contact area between the first conductive layer 26 and the second conductive layer 27. Specifically, the connecting part 28 not only includes a plane extending in X and Y directions of a bottom surface of the recess 261, but also includes side surfaces extending along a Z direction. By this design, it is possible to avoid the use of a two-dimensional connecting part in the prior art, which causes connected conductive layers to be easily separated from each other due to deformation, resulting in an increase in resistance value. It should be understood that the number of layers of the multilayer circuit board 20 of the present disclosure may include two or more layers, and is not limited thereto. Moreover, in different embodiments, the stacked via holes having the three-dimensional connecting part of the present disclosure can also be used to increase the contact area between the metal layers, thereby preventing the metal layers from being separated from each other due to deformation, resulting in an increase in resistance value.

Figure 5A:
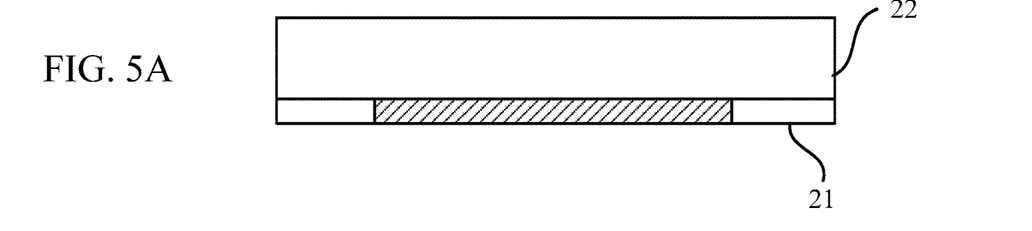
FIG. 5A to FIG. 5D are a series of schematic diagrams for showing another manufacturing process of the multilayer circuit board of FIG. 3.
Figure 5B:
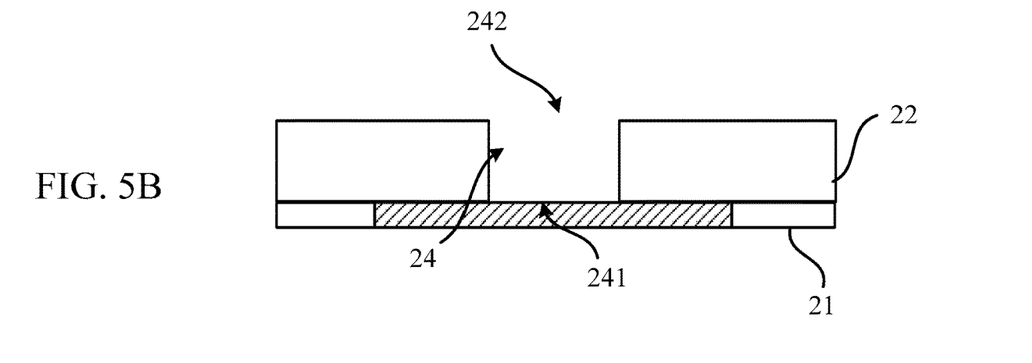

FIG. 5A to FIG. 5D are a series of schematic diagrams for showing another manufacturing process of the multilayer circuit board of FIG. 3. FIG. 5A to FIG. 5D show only a partial manufacturing process of the multilayer circuit board 20 rather than a complete manufacturing process. First, as shown in FIG. 5A, a base plate 21 provided with a conductive layer is provided and a first board 22 is provided, and the first board 22 is disposed on the base plate 21. Then, as shown in FIG. 5B, a first conductive via hole 24 is formed on the first board 22, wherein the first conductive via hole 24 includes a first end 241 and a second end 242 located on opposite sides of the first board 22.

Figure 5C:
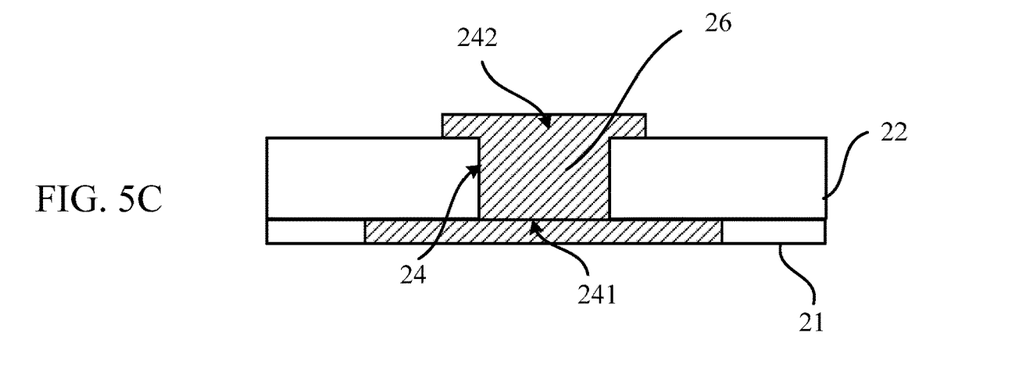
Figure 5D:
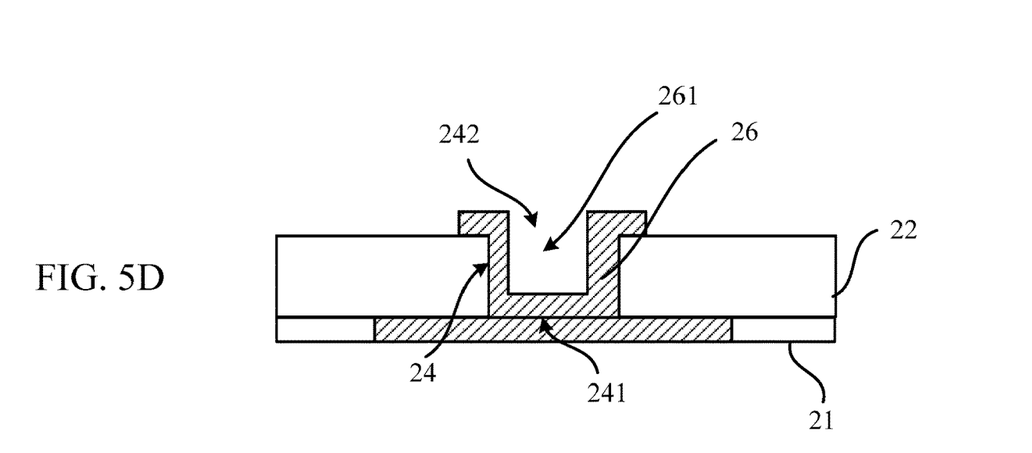

As shown in FIG. 5C, a first metal material is deposited on the first board 22 and the first conductive via hole 24 by a via-filling plating process to fill the first conductive via hole 24 and seal the first end 241 and the second end 242 of the first conductive via hole 24. A surface of the first metal material relatively protrudes outward from the second end 242 of the first conductive via hole 24. Then, as shown in FIG. 5D, a blind hole is formed on the surface of the deposited first metal material to form a first conductive layer 26 having a recess 261 on the surface, wherein the recess 261 is relatively recessed in the second end 242 of the first conductive via hole 24. Then, steps of forming the second board 23 and the second conductive layer 27 in the second embodiment are similar to those in FIG. 4D to FIG. 4F, and are not described herein again. The manufacturing method shown in FIG. 5A to FIG. 5D differs from the manufacturing method shown in FIG. 4A to FIG. 4C in that the manufacturing method shown in FIG. 5A to FIG. 5D is performed by an etching or a laser opening process for forming the recess 261 having a three-dimensional surface on the surface of the first conductive layer 26, whereby a shape of the recess 261 can be preferably controlled.

Figure 6:
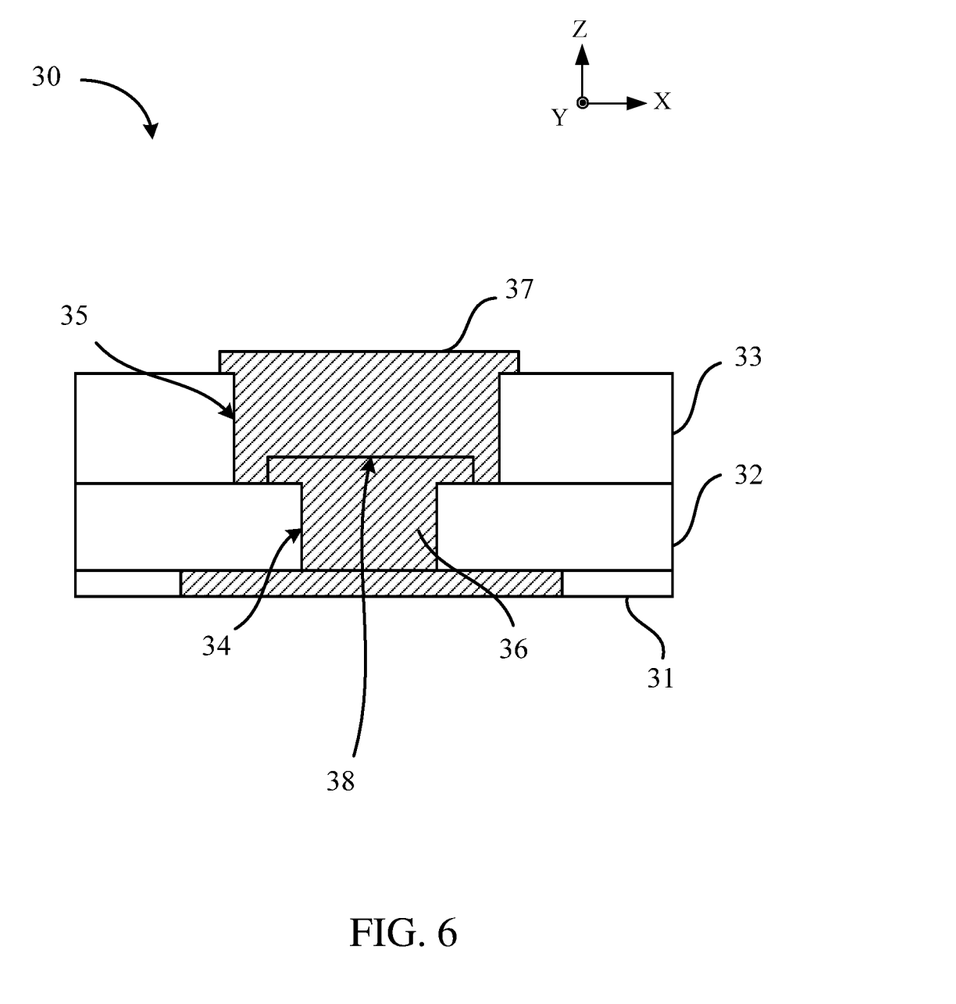
FIG. 6 is a schematic diagram showing a multilayer circuit board according to a second preferred embodiment of the present disclosure.

Please refer to FIG. 6, which is a schematic diagram showing a multilayer circuit board 30 according to a second preferred embodiment of the present disclosure. The multilayer circuit board 30 is a carrier board that integrates electronic components in an electronic product, and includes a package substrate, a printed circuit board, a high density interconnect (HDI), a probe card carrier, and the like. The multilayer circuit board 30 includes a base plate 31, a first board 32, a second board 33, a first conductive layer 36, and a second conductive layer 37. The first conductive layer 36 is disposed on the first board 32, and the second conductive layer 37 is disposed on the second board 33. Preferably, the base plate 31, the first board 32, and the second board 33 are made of an insulating dielectric material, and the three layers are stacked one on another. Moreover, the multilayer circuit board 30 transmits signals longitudinally through the base plate 31, the first board 32, and the second board 33 via the first conductive layer 36, the second conductive layer 37, and the conductive layer formed on the base plate 31.

As shown in FIG. 6, the first board 32 is provided with a first conductive via hole 34, and the second board 33 is provided with a second conductive via hole 35. Preferably, a position of the second conductive via hole 35 corresponds to a position of the first conductive via hole 34. The first conductive layer 36 is formed on the first board 32 and the first conductive via hole 34. The second conductive layer 37 is formed on the second board 33 and the second conductive via hole 35. The first conductive layer 36 and the second conductive layer 37 are in electrical contact and cooperatively define a connecting part 38. The connecting part 38 of the first conductive layer 36 and the second conductive layer 37 includes concave-convex surfaces for engaging with each other, that is, a three-dimensional surface including three directions of XYZ. The specific structure and manufacturing method of the multilayer circuit board 30 of the present disclosure will be described below by referring to FIG. 7A to FIG. 7F.

Figure 7A:
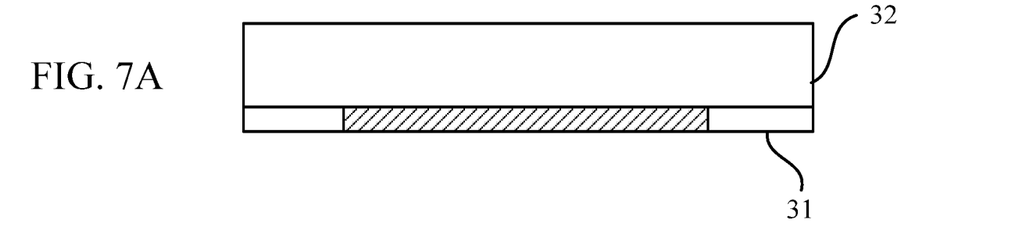
FIG. 7A to FIG. 7F are a series of schematic diagrams for showing a manufacturing process of the multilayer circuit board of FIG. 6.
Figure 7B:
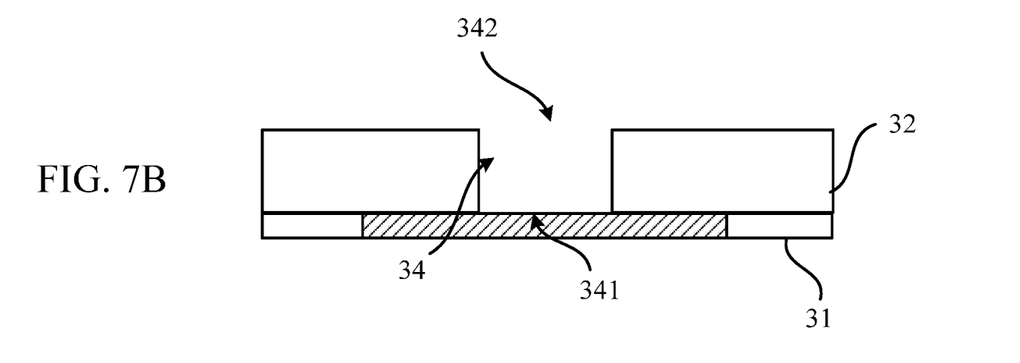

FIG. 7A to FIG. 7F are a series of schematic diagrams for showing a manufacturing process of the multilayer circuit board 30 of FIG. 6. First, as shown in FIG. 7A, the base plate 31 provided with a conductive layer is provided, and the first board 32 is provided, wherein the first board 32 is disposed on the base plate 31. Then, as shown in FIG. 7B, the first conductive via hole 34 is formed on the first board 32, wherein the first conductive via hole 34 includes a first end 341 and a second end 342 located on opposite sides of the first board 32.

Figure 7C:
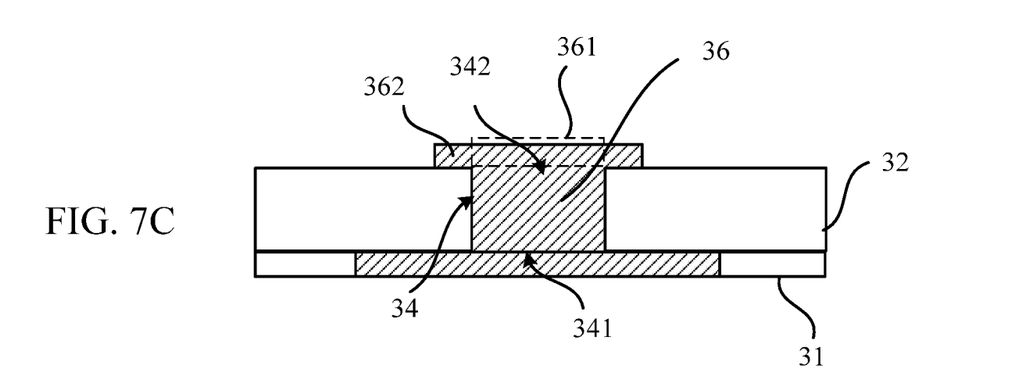

As shown in FIG. 7C, the first conductive layer 36 is formed on the first board 32 and the first conductive via hole 34, wherein the first conductive layer 36 is disposed only on a portion of the first board 32 instead of covering the first board 32 over an entire surface. Specifically, in the second embodiment, a first metal material is deposited on the first board 32 and the first conductive via hole 34 by a via-filling plating process to form the first conductive layer 36 fills the first conductive via hole 34 and seals the first end 341 and the second end 342 of the first conductive via hole 34. A deposition surface of the first metal material is relatively protruded outward from the second end 342 of the first conductive via hole 34 such that the surface of the first conductive layer 36 is formed with a protrusion 361. Also, the first conductive layer 36 further includes an annular portion 362 formed on the first board 32. The annular portion 362 is adjacent to the second end 342 of the first conductive via hole 34 and is connected to the protrusion 361.

Figure 7D:
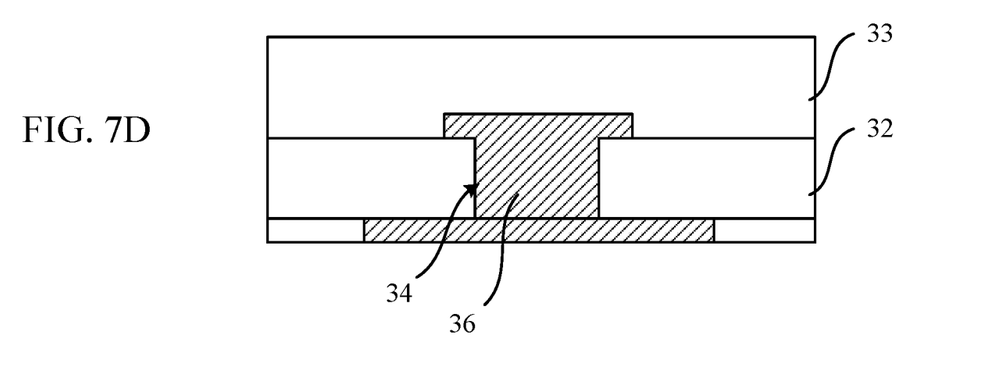
Figure 7E:
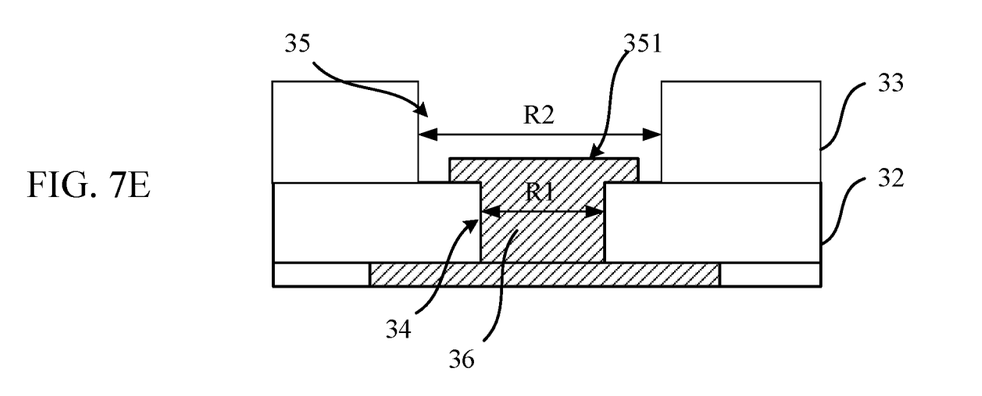

As shown in FIG. 7D, the second board 33 is provided on the first board 32 and the first conductive layer 36. Then, as shown in FIG. 7E, the second board 33 is provided with the second conductive via hole 35, wherein a position of the second conductive via hole 35 corresponds to a position of the first conductive via hole 34. The second conductive via hole 35 includes a third end 351 located on a surface of the second board 33, wherein the third end 351 of the second conductive via hole 35 is adjacent to the first conductive layer 36. In the second embodiment, a hole diameter R2 of the second conductive via hole 35 is greater than a hole diameter R1 of the first conductive via hole 34. Also, the hole diameter R2 of the second conductive via hole 35 is greater than an overall width of the first conductive layer 36, that is, greater than a maximum width of the annular portion 362 of the first conductive layer 36.

Figure 7F:
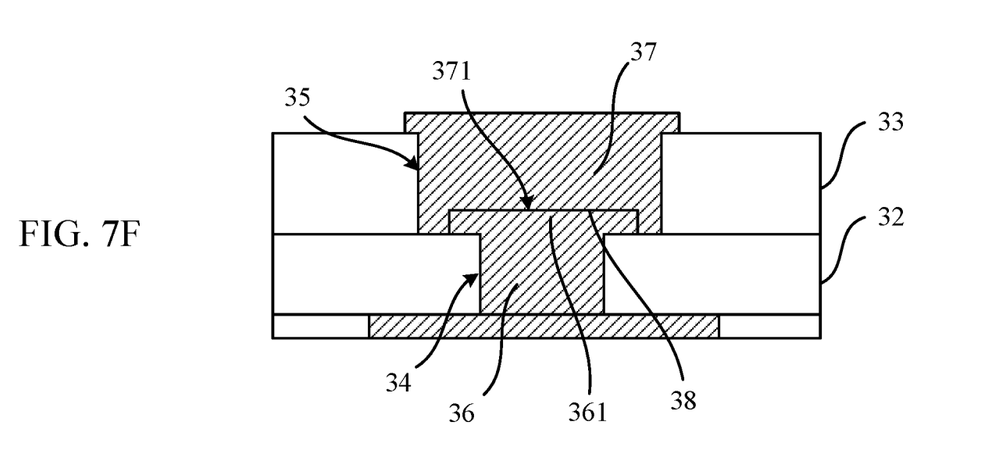

As shown in FIG. 7F, the second conductive layer 37 is formed on the second board 33 and the second conductive via hole 35, thereby completing the fabrication of the multilayer circuit board 30. The second conductive layer 37 is disposed only on a portion of the second board 33 instead of covering the second board 33 over an entire surface. Specifically, in the second embodiment, a second metal material is deposited on the first conductive layer 36, the second board 33 and the second conductive via hole 35 by a via-filling plating process to form the second conductive layer 37 covering the protrusion 361 of the first conductive layer 36 and the second conductive via hole 35. The second conductive layer 37 fills the second conductive via hole 35 and seals the third end 351 of the second conductive via hole 35, and a surface of the second conductive layer 37 corresponding to the protrusion 361 of the first conductive layer 36 is formed with a recess 371. That is, the recess 371 of the second conductive layer 37 is relatively recessed in the third end 351 of the second conductive via hole 35. The protrusion 361 of the first conductive layer 36 is in electrical contact with the recess 371 of the second conductive layer 37, and the protrusion 361 and the recess 371 cooperatively define a connecting part 38. The connecting part 38 of the first conductive layer 36 and the second conductive layer 37 includes concave-convex surfaces for engaging with each other, that is, a three-dimensional surface including three directions of XYZ.

In the second embodiment, the metal connecting part 38 at the stacked via holes (i.e., a junction of the first conductive layer 36 and the second conductive layer 37) is designed with the three-dimensional surface, that is, an inner sidewall of the recess 371 of the second conductive layer 37 runs around an outer sidewall of the protrusion 361 of the first conductive layer 36, thereby increasing the contact area between the first conductive layer 36 and the second conductive layer 37. Specifically, the connecting part 38 not only includes a plane extending in X and Y directions of a top surface of the protrusion 361, but also includes side surfaces extending along a Z direction. By this design, it is possible to avoid the use of a two-dimensional connecting part in the prior art, which causes connected conductive layers to be easily separated from each other due to deformation, resulting in an increase in resistance value. It should be understood that the number of layers of the multilayer circuit board 30 of the present disclosure may include two or more layers, and is not limited thereto. Moreover, in different embodiments, the stacked via holes having the three-dimensional connecting part of the present disclosure can also be used to increase the contact area between the metal layers, thereby preventing the metal layers from being separated from each other due to deformation, resulting in an increase in resistance value.

Figure 8:
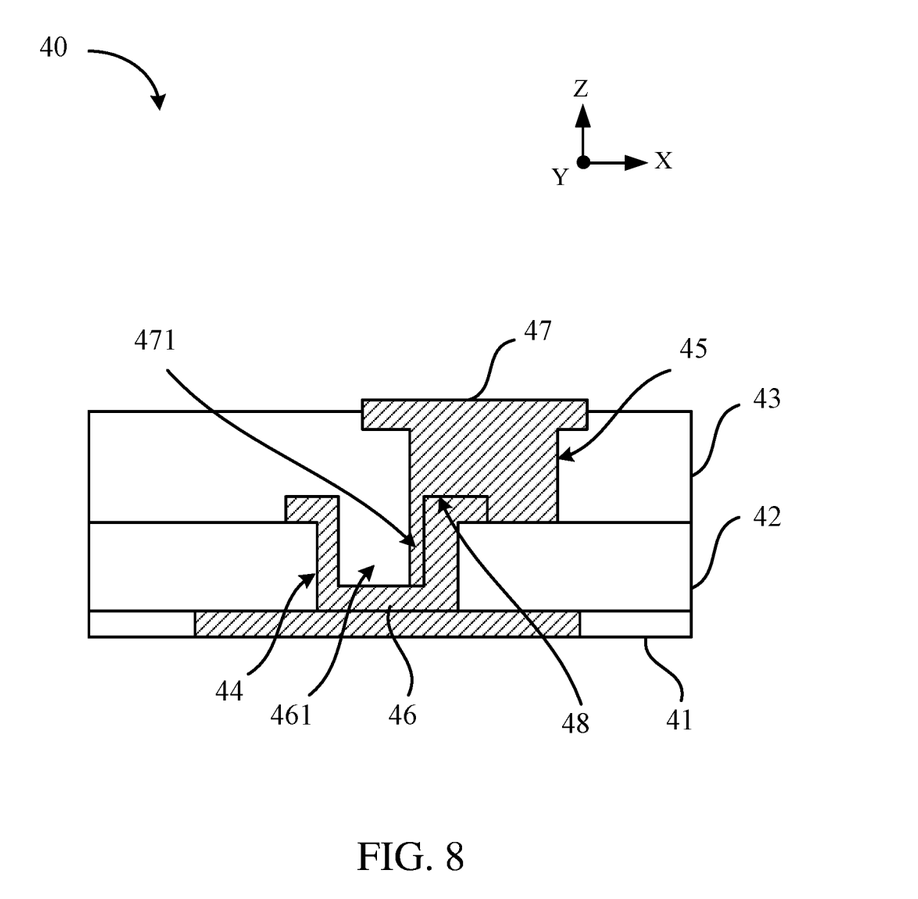
FIG. 8 is a schematic diagram showing a multilayer circuit board according to a third preferred embodiment of the present disclosure.

Please refer to FIG. 8, which is a schematic diagram showing a multilayer circuit board 40 according to a third preferred embodiment of the present disclosure. The multilayer circuit board 40 includes a base plate 41, a first board 42, a second board 43, a first conductive layer 46, and a second conductive layer 47. The first conductive layer 46 is disposed on the first board 42, and the second conductive layer 47 is disposed on the second board 43. Preferably, the base plate 41, the first board 42, and the second board 43 are made of an insulating dielectric material, and the three layers are stacked one on another. Moreover, the multilayer circuit board 40 transmits signals longitudinally through the base plate 41, the first board 42, and the second board 43 via the first conductive layer 46, the second conductive layer 47, and the conductive layer formed on the base plate 41.

As shown in FIG. 8, the third embodiment of the present disclosure differs from the first embodiment in that the first board 42 is provided with a first conductive via hole 44, and the second board 43 is provided with a second conductive via hole 45, wherein a position of the second conductive via hole 45 and a positions of the first conductive via hole 44 only partially overlap. That is, centers of the first conductive via hole 44 and the second conductive via hole 45 are offset from each other instead of being aligned with each other. The first conductive layer 46 is formed on the first board 42 and the first conductive via hole 44. The second conductive layer 47 is formed on the second board 43 and the second conductive via hole 45. The first conductive layer 46 and the second conductive layer 47 are in electrical contact and cooperatively define a connecting part 48. The connecting part 48 of the first conductive layer 46 and the second conductive layer 47 includes concave-convex surfaces for engaging with each other, that is, a three-dimensional surface including three directions of XYZ.

As shown in FIG. 8, in the third embodiment, the metal connecting part 48 at the stacked via holes (i.e., a junction of the first conductive layer 46 and the second conductive layer 47) is designed with the three-dimensional surface, that is, an inner sidewall of the recess 461 of the first conductive layer 46 runs around an outer sidewall of the protrusion 471 of the second conductive layer 47, thereby increasing the contact area between the first conductive layer 46 and the second conductive layer 47. Specifically, the connecting part 48 not only includes a plane extending in X and Y directions of a bottom surface of the recess 461, but also includes side surfaces extending along a Z direction. By this design, it is possible to avoid the use of a two-dimensional connecting part in the prior art, which causes connected conductive layers to be easily separated from each other due to deformation, resulting in an increase in resistance value. It should be understood that the number of layers of the multilayer circuit board 20 of the present disclosure may include two or more layers, and is not limited thereto. Moreover, in different embodiments, the stacked via holes having the three-dimensional connecting part of the present disclosure can also be used to increase the contact area between the metal layers, thereby preventing the metal layers from being separated from each other due to deformation, resulting in an increase in resistance value.

In summary, the present disclosure discloses that a metal connecting part at stacked via holes of the multilayer circuit board is designed with a three-dimensional surface, that is, the connecting part not only includes a plane extending in X and Y directions, but also includes side surfaces extending along a Z direction, thereby increasing a contact area between the first conductive layer and the second conductive layer. Therefore, the first conductive layer and the second conductive layer of the present disclosure increase a vertical conduction path under the existing planar metal conduction connection design, so that the first conductive layer and the second conductive layer are prevented from being deformed when the multilayer circuit board is in a high temperature and high humidity application environment, or subjected to thermal shock in the process. This is because expansion coefficients of a metal material and a dielectric material are different, and the first conductive layer and the second conductive layer will separate from each other around the connecting part.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. A multilayer circuit board, comprising:
    a first board comprising a first conductive via hole, wherein the first conductive via hole comprises a first end and a second end respectively formed on opposite sides of the first board;
    a first conductive layer formed on the first board and the first conductive via hole, wherein the first conductive layer fills the first conductive via hole and seals the first end of the first conductive via hole;
    a second board disposed on the first board and the first conductive layer and comprising a second conductive via hole; and
    a second conductive layer formed on the second board and the second conductive via hole, wherein the first conductive layer and the second conductive layer contact with each other and cooperatively define a connecting part, and the connecting part of the first conductive layer and the second conductive layer comprises concave-convex surfaces which engage with each other;
    wherein a surface of the first conductive layer is formed with a recess, and the recess is recessed in the second end of the first conductive via hole.

2. The multilayer circuit board as claimed in claim 1, wherein a surface of the second conductive layer is formed with a protrusion, and the recess of the first conductive layer is electrically contacted to the protrusion of the second conductive layer, and the connecting part comprises contact surfaces of the recess and the protrusion.

3. The multilayer circuit board as claimed in claim 2, wherein the second conductive via hole comprises a third end formed on a surface of the second board; and
    the second conductive layer fills the second conductive via hole and seals the third end of the second conductive via hole, and the protrusion of the second conductive layer protrudes outward from the third end of the second conductive via hole.

4. The multilayer circuit board as claimed in claim 1, wherein the first conductive layer further comprises an annular portion formed on the first board, and the annular portion is adjacent to the second end of the first conductive via hole and connected to a top end of the recess.

5. A multilayer circuit board, comprising:
    a first board comprising a first conductive via hole, wherein the first conductive via hole comprises a first end and a second end respectively formed on opposite sides of the first board;
    a first conductive layer formed on the first board and the first conductive via hole, wherein the first conductive layer fills the first conductive via hole, and seals the first end and the second end of the first conductive via hole;
    a second board disposed on the first board and the first conductive layer and comprising a second conductive via hole; and
    a second conductive layer formed on the second board and the second conductive via hole, wherein the first conductive layer and the second conductive layer contact with each other and cooperatively define a connecting part, and the connecting part of the first conductive layer and the second conductive layer comprises concave-convex surfaces which engage with each other;
    wherein a surface of the first conductive layer is formed with a protrusion, and the protrusion protrudes outward from the second end of the first conductive via hole.

6. The multilayer circuit board as claimed in claim 5, wherein a surface of the second conductive layer is formed with a recess, and the recess of the second conductive layer is electrically contacted to the protrusion of the first conductive layer, and the connecting part comprises contact surfaces of the recess and the protrusion.

7. The multilayer circuit board as claimed in claim 6, wherein the second conductive via hole comprises a third end formed on a surface of the second board; and
    the second conductive layer fills the second conductive via hole, and the recess of the second conductive layer is recessed in the third end of the second conductive via hole.

8. The multilayer circuit board as claimed in claim 5, wherein the first conductive layer further comprises an annular portion formed on the first board, and the annular portion is adjacent to the second end of the first conductive via hole and connected to the protrusion.

9. The multilayer circuit board as claimed in claim 5, wherein a hole diameter of the second conductive via hole is greater than a hole diameter of the first conductive via hole.

10. A manufacturing method of a multilayer circuit board, comprising:
    providing a first board;
    forming a first conductive via hole on the first board, wherein the first conductive via hole comprises a first end and a second end respectively formed on opposite sides of the first board;
    depositing a first metal material on the first board and the first conductive via hole to form a first conductive layer on the first board and the first conductive via hole, wherein the first conductive layer fills the first conductive via hole and seals the first end of the first conductive via hole;
    disposing a second board on the first board and the first conductive layer;
    forming a second conductive via hole on the second board; and
    forming a second conductive layer on the second board and the second conductive via hole, wherein the first conductive layer and the second conductive layer contact with each other and cooperatively define a connecting part, and the connecting part of the first conductive layer and the second conductive layer comprises concave-convex surfaces which engage with each other;
    wherein a surface of the first conductive layer is formed with a recess, and the recess is recessed in the second end of the first conductive via hole.

11. The manufacturing method of a multilayer circuit board as claimed in claim 10, wherein
    a thickness of the first conductive layer is uniform.

12. The manufacturing method of a multilayer circuit board as claimed in claim 10, wherein the step of depositing the first metal material on the first board and the first conductive via hole to form the first conductive layer on the first board and the first conductive via hole comprises:
    forming a blind hole on a surface of the first metal material to form the recess.

13. The manufacturing method of a multilayer circuit board as claimed in claim 10, wherein the step of forming the second conductive layer on the second board and the second conductive via hole comprises:

depositing a second metal material on the first conductive layer, the second board, and the second conductive via hole to form the second conductive layer filling the recess of the first conductive layer and the second conductive via hole, wherein a surface of the second conductive layer is formed with a protrusion corresponding to the recess of the first conductive layer, and the recess of the first conductive layer is electrically contacted to the protrusion of the second conductive layer, and the connecting part comprises contact surfaces of the recess and the protrusion.

* * * * *